United States Patent
Inazuki et al.

(10) Patent No.: US 10,788,747 B2
(45) Date of Patent: Sep. 29, 2020

(54) PHOTOMASK BLANK AND METHOD FOR PRODUCING PHOTOMASK

(71) Applicant: Shin-Etsu Chemical Co., Ltd., Tokyo (JP)

(72) Inventors: Yukio Inazuki, Joetsu (JP); Kouhei Sasamoto, Joetsu (JP); Naoki Matsuhashi, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 105 days.

(21) Appl. No.: 16/177,659

(22) Filed: Nov. 1, 2018

(65) Prior Publication Data

US 2019/0146329 A1 May 16, 2019

(30) Foreign Application Priority Data

Nov. 13, 2017 (JP) ................ 2017-218156

(51) Int. Cl.
*G03F 1/38* (2012.01)
*G03F 1/58* (2012.01)
*G03F 1/80* (2012.01)
*G03F 1/26* (2012.01)

(52) U.S. Cl.
CPC ............... *G03F 1/38* (2013.01); *G03F 1/26* (2013.01); *G03F 1/58* (2013.01); *G03F 1/80* (2013.01)

(58) Field of Classification Search
CPC ..... G03F 1/38; G03F 1/58; G03F 1/80; G03F 1/26
See application file for complete search history.

(56) References Cited

U.S. PATENT DOCUMENTS

| 7,166,392 | B2 | 1/2007 | Ushida et al. |
| 9,778,559 | B2 | 10/2017 | Kosaka et al. |
| 9,778,560 | B2 | 10/2017 | Kosaka |
| 2007/0212618 | A1* | 9/2007 | Yoshikawa ............... G03F 1/32 430/5 |
| 2007/0212619 | A1* | 9/2007 | Yoshikawa ............... C23F 4/00 430/5 |
| 2011/0104592 | A1 | 5/2011 | Iwashita et al. |
| 2016/0291455 | A1* | 10/2016 | Kosaka .................... G03F 1/26 |

(Continued)

FOREIGN PATENT DOCUMENTS

| EP | 3 196 698 A1 | 7/2017 |
| JP | 3093632 U | 5/2003 |

(Continued)

OTHER PUBLICATIONS

European Search Report for Appl. No. 18203305.0 dated May 6, 2019.

*Primary Examiner* — Stewart A Fraser
(74) *Attorney, Agent, or Firm* — Birch, Stewart, Kolasch & Birch, LLP

(57) ABSTRACT

A photomask blank comprising a transparent substrate and a Cr-containing film is provided. The Cr-containing film includes a layer which is composed of a C-containing Cr compound and further contains O or O and N. The layer has a C/Cr atomic ratio of at least 0.3 and a N/Cr atomic ratio of up to 0.1, and has a Cr content of up to 50 at % and a C/O atomic ratio of at least 0.8, or a Cr content of up to 60 at % and a C/O atomic ratio of at least 1. The photomask blank is processed into a photomask by dry etching the Cr-containing film.

13 Claims, 9 Drawing Sheets

(56) References Cited

U.S. PATENT DOCUMENTS

2017/0168384 A1  6/2017  Shishido et al.
2017/0212417 A1  7/2017  Kosaka et al.

FOREIGN PATENT DOCUMENTS

| JP | 2003-195479 A | 7/2003 |
| JP | 2003-195483 A | 7/2003 |
| JP | 2016-191885 A | 11/2016 |
| JP | 2016-194626 A | 11/2016 |
| JP | 2017-129808 A | 7/2017 |

* cited by examiner

PHOTOMASK BLANK AND METHOD FOR PRODUCING PHOTOMASK

CROSS-REFERENCE TO RELATED APPLICATION

This non-provisional application claims priority under 35 U.S.C. § 119(a) on Patent Application No. 2017-218156 filed in Japan on Nov. 13, 2017, the entire contents of which are hereby incorporated by reference.

TECHNICAL FIELD

This invention relates to a photomask blank which is processed into a photomask suitable for pattern transfer using exposure light, and a method for producing a photomask from the photomask blank.

BACKGROUND ART

For goals like a higher speed of operation and a saving of power consumption of microelectronic devices, the challenge to higher integration of large-scale integrated circuits continues. To meet increasing demands for shrinkage of circuit patterns, the advanced semiconductor microprocessing technology becomes important. For example, the technology for shrinkage of circuit-constructing wiring patterns and the technology for shrinkage of contact hole patterns for cell-constructing inter-layer connections become essential.

The advanced microprocessing technology relies on the photolithography using photomasks. The photomask is one important area of the miniaturization technology as are the lithography system and resist material. For the purpose of obtaining a photomask having a fine-size wiring pattern or fine-size contact hole pattern, efforts are made to develop the technique of forming a finer size pattern on a photomask blank at a higher accuracy.

In order to form a high accuracy photomask pattern on a photomask substrate, it is of first priority to pattern a resist film on a photomask blank at a high accuracy. Since the photolithography for microprocessing semiconductor substrates employs reduction projection, the size of a pattern formed on a photomask is about 4 times the size of a pattern formed on a semiconductor substrate. This does not mean that the accuracy of the pattern formed on the photomask is accordingly loosened. It is necessary that the photomask pattern be formed at a high accuracy.

At the present, the size of a circuit pattern written on a semiconductor substrate by photolithography is far smaller than the wavelength of exposure light. If reduction exposure is carried out using a photomask having a pattern which is a mere 4-time magnification of the circuit pattern, the photomask pattern is not faithfully transferred to the resist film due to interference of exposure light and other impacts.

Super-resolution masks addressing the problem include OPC masks in which the so-called optical proximity correction (OPC), i.e., the technology for correcting the optical proximity effect of degrading transfer properties is applied to photomasks and phase shift masks which cause a phase shift of 180° to exposure light transmitted by the pattern, to establish a sharp intensity distribution of incident light. For example, in some OPC masks, an OPC pattern (hammer head, assist bar or the like) having a size of less than half of a circuit pattern is formed. The phase shift masks include halftone, Levenson and chromeless types.

In general, a mask pattern is formed by starting with a photomask blank having a light-shielding film on a transparent substrate, forming a photoresist film on the photomask blank, exposing the photoresist film to light or electron beam (EB) to write a pattern, and developing the photoresist film to form a photoresist pattern. Then, with the photoresist pattern made etching mask, the light-shielding film is etched or patterned to form the photomask pattern. For obtaining a fine photomask pattern, it is effective to reduce the thickness of a photoresist film (i.e., thinner resist film), for the following reason.

If only a resist pattern is shrunk without reducing the thickness of a resist film, the resist pattern feature functioning as the etching mask for the light-shielding film has a higher aspect ratio (ratio of resist film thickness to feature width). In general, as the aspect ratio of resist pattern features becomes higher, the pattern profile is more likely to degrade. Then the accuracy of pattern transfer to the light-shielding film is reduced. In extreme cases, the resist pattern partially collapses or strips off, resulting in pattern dropouts. In association with the shrinkage of a photomask pattern, it is necessary that the resist film used as the etching mask during patterning of a light-shielding film be thinned to prevent the aspect ratio from becoming too high. An aspect ratio of up to 3 is generally recommended. To form a resist pattern having a feature width of 70 nm, for example, a resist film thickness of up to 210 nm is preferable.

On the other hand, in the ArF lithography using a photomask and ArF excimer laser as exposure light, the photomask pattern is transferred to a processable substrate, typically a photoresist film on a semiconductor wafer. Under the current advance of the miniaturization technology, the pattern width is less than 30 nm on the processable substrate. The minimum width of a pattern on the photomask that complies with the reduced pattern width is below 100 nm (specifically, about 70 nm).

For the light-shielding film which is etched using the pattern of photoresist as an etching mask, a number of materials have been proposed. In particular, a chromium film and chromium compound films containing chromium and at least one element of nitrogen, oxygen and carbon are generally used as the light-shielding film material. For example, Patent Documents 1 to 3 disclose photomask blanks wherein chromium compound films are formed as the light-shielding film having light shielding properties necessary for the photomask for use in ArF excimer laser lithography.

CITATION LIST

Patent Document 1: JP-A 2003-195479
Patent Document 2: JP-A 2003-195483
Patent Document 3: JP-U 3093632
Patent Document 4: JP-A 2016-191885 (U.S. Pat. No. 9,778,560)
Patent Document 5: JP-A 2016-194626
Patent Document 6: JP-A 2017-129808 (US 20170212417, EP 3196698)

DISCLOSURE OF INVENTION

When a chromium-containing film which serves as the light-shielding film of a photomask is patterned, it is important, from the standpoint of accurately forming a smaller size pattern, to control the cross-sectional profile of the pattern. For example, where a photomask blank has a chromium-containing film and a silicon-containing hard mask film thereon, the chromium-containing film is precisely patterned, as compared with the direct formation of a pattern in the chromium-containing film through a resist pattern. This is due to a lowering of the loading effect and an improvement in linearity by the hard mask film, because the size of the hard mask film is substantially unchanged during etching of the chromium-containing film. However, the lithography generation has recently proceeded to a photomask with a half-pitch of up to 20 nm, and even up to 10 nm. As the photomask pattern becomes miniaturized, more accurate pattern formation is necessary. For instance, a size accuracy of the order of several nanometers is required. Even when the chromium-containing film is patterned through the pattern of a hard mask film, it is required to control the cross-sectional profile of the pattern more precisely.

In controlling the cross-sectional profile of a pattern of a chromium-containing film, it is important to reduce side etching during etching for pattern formation. Also, when a pattern is formed in a chromium-containing film using a pattern of a hard mask film, side etching of the chromium-containing film has substantial impact on the accuracy of the pattern. Therefore, reduction of side etching is a consideration not only in the case of direct formation of a pattern in a chromium-containing film through a pattern of resist film, but also when a photomask blank has a hard mask film (or etching mask film), in the case of formation of a pattern in the chromium-containing film through a pattern of the hard mask film. Particularly when the chromium-containing film is a light-shielding film, it must have a thickness above a certain level in order to insure an optical density necessary as a light-shielding film with respect to exposure light. Since etching of such a thick film for pattern formation takes a longer time, the reduction of side etching is more important.

A chromium-containing film such as chromium compound film serving as the light-shielding film or the like is generally patterned by oxygen-containing chlorine-base dry etching. The dry etching of a chromium compound film is not anisotropic dry etching. The etching rate of a chromium-containing film in direction orthogonal to thickness direction (i.e., film surface direction) is high relative to the etching rate of the film in thickness direction. Thus, the chromium-containing film is susceptible to side etching. Greater side etching fails to provide in-plane uniformity of dry etching, affecting the accuracy of pattern size.

One exemplary photomask blank has a chromium-containing film and an underlying film such as a film of silicon-containing, transition metal-free material or transition metal and silicon-containing material on a transparent substrate. If the underlying film or substrate is patterned using a pattern of the chromium-containing film as an etching mask, there arise problems of pattern transfer capability being degraded, for example, a substantial deviation of a pattern size of the etched film or substrate from the design size.

An object of the invention is to provide a photomask blank having a chromium-containing film which undergoes minimal side etching when etched to form a photomask pattern therein, and thus forms a photomask pattern of satisfactory cross-sectional profile at a high accuracy; and a method for producing a photomask from the photomask blank.

The inventors have found that the outstanding problems are solved when a chromium-containing film is constructed by a single layer or multiple layers, the single layer to or at least one of the multiple layers is a layer which is composed of a carbon-containing chromium compound and further contains oxygen or oxygen and nitrogen, and the layer composed of a carbon-containing chromium compound has a specific composition. Then the chromium-containing film undergoes minimal side etching during pattern formation, and forms a photomask pattern of satisfactory cross-sectional profile. Even when a fine photomask pattern is necessary, the photomask pattern can be formed at a high accuracy. The chromium-containing film complies with the detection of smaller defects as required for the next generation photomasks with a half-pitch of up to 20 nm or even up to 10 nm.

In one aspect, the invention provides a photomask blank which is processed into a photomask suitable for pattern transfer using exposure light of wavelength up to 250 nm, comprising a transparent substrate and a chromium-containing film which is disposed on the substrate directly or through an optical film and dry etchable with oxygen-containing chlorine base gas. The chromium-containing film is constructed by a single layer or multiple layers, the single layer or at least one of the multiple layers is a layer which is composed of a carbon-containing chromium compound and further contains oxygen or oxygen and nitrogen. The layer composed of a carbon-containing chromium compound and further containing oxygen or oxygen and nitrogen has a composition having an atomic ratio of carbon to chromium of at least 0.3 and an atomic ratio of nitrogen to chromium of up to 0.1, and having a chromium content of up to 50 at % and an atomic ratio of carbon to oxygen of at least 0.8, or a chromium content of up to 60 at % and an atomic ratio of carbon to oxygen of at least 1.

In a preferred embodiment, the layer composed of a carbon-containing chromium compound and further containing oxygen or oxygen and nitrogen has an oxygen content of at least 20 at %.

In a preferred embodiment, the surface of the chromium-containing film disposed remote from the substrate has a root mean square roughness (RMS) of up to 1 nm and a maximum height difference (Rmax) of up to 9 nm, as analyzed on any area of 1 μm squares by surface profile measurement under atomic force microscope.

In a preferred embodiment, the chromium-containing film has a thickness of up to 70 nm.

In a preferred embodiment, the chromium-containing film has an optical density of at least 1.5 with respect to the exposure light.

In a preferred embodiment, the chromium-containing film is constructed by multiple layers, the layer of the chromium-containing film which is disposed remotest from the substrate is a layer composed of a carbon-free chromium compound.

More preferably, the layer composed of a carbon-free chromium compound contains nitrogen or nitrogen and oxygen and has a nitrogen content of at least 5 at % and a thickness of 1 to 5 nm.

Even more preferably, the layer composed of a carbon-free chromium compound contains nitrogen and oxygen and has a chromium content of up to 50 at % and a nitrogen content of at least 40 at %.

In a preferred embodiment, the chromium-containing film is disposed on the transparent substrate through the optical film, and the optical film includes a phase shift film formed of a material containing silicon, but not a transition metal or a material containing silicon and a transition metal.

More preferably, the sum of optical densities of the chromium-containing film and the phase shift film with respect to the exposure light is at least 2.5.

The photomask blank may further comprise a hard mask film of silicon-containing material on the chromium-containing film.

In another aspect, the invention provides a method for producing a photomask from the photomask blank defined above, comprising the step of patterning the chromium-containing film of the photomask blank by oxygen-containing chlorine base dry etching.

Advantageous Effects of Invention

The photomask blank of the invention has a chromium-containing film which may be dry etched to form a pattern of satisfactory cross-sectional profile, that is, having a photomask pattern transfer ability. From the photomask blank, a photomask having a fine photomask pattern with a high accuracy is produced.

DESCRIPTION OF PREFERRED EMBODIMENTS

Figure 1:
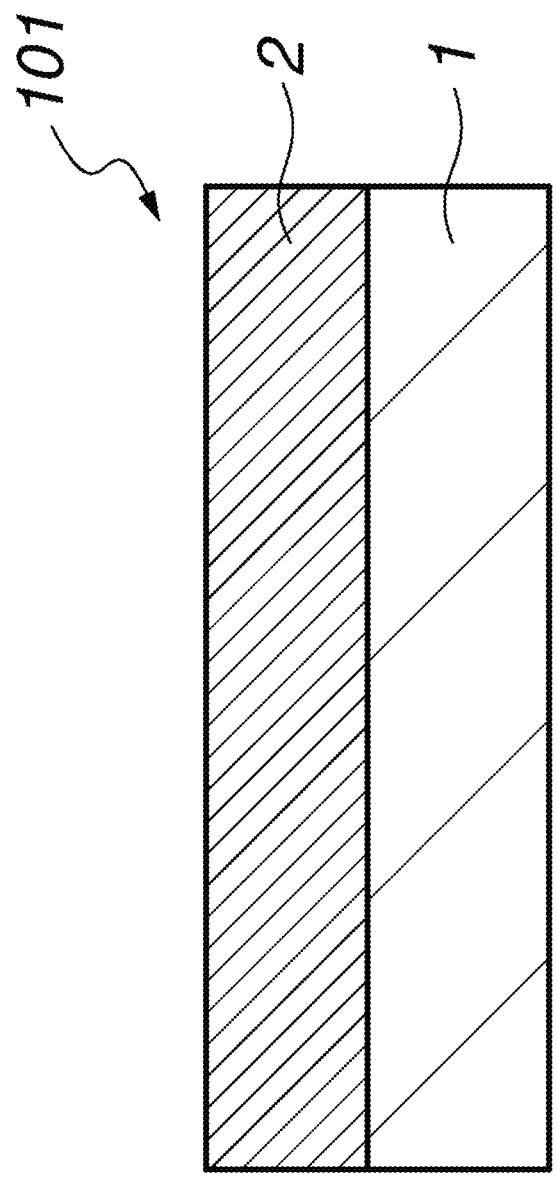
FIG. 1 is a cross-sectional view of a photomask blank in a first embodiment of the invention.

The photomask blank of the invention is to be processed into a photomask suitable for pattern transfer using exposure light of wavelength up to 250 nm, especially up to 200 nm, typically KrF excimer laser of 248 nm or ArF excimer laser of 193 nm.

The photomask blank includes a transparent substrate and a chromium-containing film. The chromium-containing film may be disposed on the substrate directly or through one or more optical films. Although the transparent substrate is not particularly limited in type and size, quartz substrates which are transparent at the wavelength of exposure light are suitable. For example, preference is given to quartz substrates of 6 inch squares and 0.25 inch thick, known as 6025 substrates, as prescribed in the SEMI standards, or quartz substrates of 152 mm squares and 6.35 mm thick when expressed in the SI units.

The chromium-containing film is composed of a material which can be etched by oxygen-containing chlorine-base dry etching, i.e., dry etching with etchant gas containing oxygen gas and chlorine gas. The chromium-containing film is constructed by a single layer or multiple layers, the single layer or at least one of the multiple layers is a layer which is composed of a carbon-containing chromium compound (referred to as "carbon-containing chromium layer," hereinafter). The carbon-containing chromium layer contains oxygen or oxygen and nitrogen as well as chromium and carbon. The carbon-containing chromium layer may further contain light elements such as hydrogen and halogen, argon, or the like. Exemplary of the carbon-containing chromium compound are chromium oxycarbide (CrOC) and chromium oxide carbide nitride (CrOCN).

The carbon-containing chromium layer has a ratio of carbon to chromium which is preferably at least 0.2, more preferably at least 0.3, even more preferably at least 0.4, and most preferably at least 0.5 in atomic ratio. The upper limit of C/Cr ratio of the carbon-containing chromium layer is preferably up to 1.5, more preferably up to 1.2 in atomic ratio. Also, the carbon-containing chromium layer preferably has a ratio of nitrogen to chromium which is up to 0.1 in atomic ratio. More preferably the carbon-containing chromium layer is substantially free of nitrogen. The carbon-containing chromium layer has a ratio of carbon to oxygen which is preferably at least 0.8, more preferably at least 1, even more preferably at least 1.1 in atomic ratio. The upper limit of C/O ratio of the carbon-containing chromium layer is preferably up to 3, more preferably up to 2 in atomic ratio.

The carbon-containing chromium layer has a chromium content of preferably up to 70 at %, more preferably up to 60 at %, even more preferably up to 50 at % and preferably at least 30 at %, more preferably at least 40 at %. The carbon-containing chromium layer has a carbon content of preferably at least 15 at %, more preferably at least 20 at %, even more preferably at least 25 at % and preferably up to 50 at %, more preferably up to 40 at %. Inclusion of oxygen is preferable because the etching rate becomes higher. If the amount of oxygen relative to carbon is excessive, then substantial side etching occurs. Thus, the carbon-containing chromium layer has an oxygen content of preferably at least 10 at %, more preferably at least 20 at %, even more preferably at least 25 at % and preferably up to 60 at %, more preferably up to 50 at %. Nitrogen is an element which is effective for tailoring the cross-sectional profile of a pattern, but allows for substantial side etching. Thus, the carbon-containing chromium layer has a nitrogen content of preferably up to 10 at %, more preferably up to 5 at %. Nitrogen may be distributed locally in thickness direction of or throughout the chromium-containing film. Better results are obtained when nitrogen is incorporated in the chromium-containing film such that the film has a higher nitrogen content on the substrate side. It is noted that the total content of chromium, carbon, oxygen and nitrogen in the carbon-containing chromium layer is preferably at least 80 at %, more preferably at least 90 at %, and most preferably 100 at %.

When the carbon-containing chromium layer has a chromium content of up to 50 at %, the atomic ratio of C/O is preferably at least 0.8. When the carbon-containing chromium layer has a chromium content of up to 60 at %, the atomic ratio of C/O is preferably at least 1. These compositions are more preferable when the atomic ratio of C/Cr is at least 0.3 and the atomic ratio of N/Cr is up to 0.1.

Also, when the carbon-containing chromium layer has an oxygen content of at least 20 at %, the atomic ratio of C/O is preferably at least 1. Further, when the carbon-containing chromium layer has a chromium content of up to 50 at %, the atomic ratio of C/Cr is preferably at least 0.2.

In the embodiment wherein the chromium-containing film is constructed by multiple layers, the chromium-containing film may include a layer of carbon-free chromium compound (sometimes referred to as "carbon-free chromium layer," hereinafter) as the layer disposed remotest from the substrate. The carbon-free chromium layer is preferable because it may function as a layer for protecting the surface of the chromium-containing film and is effective for improving resistance to cleaning. The carbon-free chromium layer contains oxygen or oxygen and nitrogen as well as chromium, and may further contain light elements such as hydrogen and halogen, argon, or the like. Exemplary of the carbon-free chromium compound are chromium nitride (CrN) and chromium oxynitride (CrON).

The carbon-free chromium layer has a chromium content of preferably up to 60 at %, more preferably up to 50 at %, and preferably at least 30 at %, more preferably at least 40 at %. The carbon-free chromium layer has an oxygen content of preferably up to 70 at %, more preferably up to 60 at %. The carbon-free chromium layer has a nitrogen content of preferably at least 5 at %, more preferably at least 10 at %, even more preferably at least 40 at %, and preferably up to 70 at %, more preferably up to 60 at %. The total content of chromium, oxygen and nitrogen in the carbon-free chromium layer is preferably at least 80 at %, more preferably at least 90 at %, most preferably 100 at %. The carbon-free chromium compound is typically chromium oxynitride (CrON) and in this case, preferably the chromium content is up to 50 at % and the nitrogen content is at least 40 at %.

In a preferred embodiment, the surface of the chromium-containing film which is disposed remote from the transparent substrate has a root mean square roughness (RMS) of up to 1 nm and a maximum height difference (Rmax) (i.e., maximum difference between peaks and valleys) of up to 9 nm, especially up to 8 nm, as analyzed on any area of 1 μm squares by surface profile measurement under atomic force microscope. The chromium-containing film having such surface profile or topography is advantageous because it complies with the detection of smaller defects as required for photomasks of the next generation with a half-pitch of up to 20 nm, or even up to 10 nm, and even when sensitivity is increased during defect inspection, it causes neither diffuse reflection nor a lowering of inspection sensitivity. The surface profile may be established in the range of the chromium-containing film where a pattern is to be formed, for example, preferably a central area of the surface (152 mm squares) of 6025 substrate on which a chromium-containing film is formed, specifically a square area of 132 mm×132 mm, more specifically 142 mm×142 mm.

The chromium-containing film having such surface profile or topography is formed, for example, by depositing a chromium-containing film (including carbon-containing chromium layer and carbon-free chromium layer) of the above-defined composition by reactive sputtering of inert gas and reactive gas, preferably under the following conditions. During sputter deposition, the power applied across the target and the flow rate of inert gas are kept constant, and the flow rate of reactive gas into the chamber is swept by increasing and then decreasing the flow rate. Then a hysteresis curve is drawn by plotting the flow rate of reactive gas and sputtering voltage values (target voltage values) or sputtering current values (target current values) upon sweeping of the reactive gas flow rate (see Patent Documents 4, 5 and 6, for example). Provided that "metal mode" refers to the region where the reactive gas flow rate is below the lower limit of the hysteresis region, "reaction mode" refers to the region where the reactive gas flow rate is above the upper limit of the hysteresis region, and "transition mode" refers to the region between the metal mode and the reaction mode, sputter deposition is performed outside the transition mode, that is, in the metal mode or in the reaction mode such that the chromium-containing film (including carbon-containing chromium layer and carbon-free chromium layer) may have the desired composition.

The chromium-containing film preferably has a (total) thickness of up to 70 nm, more preferably up to 60 nm. When the chromium-containing film consists of multiple layers, the carbon-containing chromium layer accounts for preferably at least 70%, more preferably at least 80%, even more preferably at least 90% of the total thickness of the chromium-containing film. On the other hand, the carbon-free chromium layer preferably has a thickness of at least 1 nm and up to 5 nm. The chromium-containing film preferably has an optical density of at least 1.5 with respect to exposure light.

The chromium-containing film may be a film having any function, for example, an optical film such as light-shielding film, antireflective film, or phase shift film (typically halftone phase shift film), or an auxiliary processing film such as hard mask film (etching mask film) or etching stop film. The term "optical film" sometimes encompasses an auxiliary processing film functioning as hard mask film or etching stop film as long as after processing of the photomask blank to a photomask, it is left on the photomask and functions as an optical film. It is noted that in connection with processing of the photomask blank to a photomask, the etching stop film is a film which is left on the photomask whereas the hard mask film may be either a film which is left on the photomask or a film which is completely removed from the photomask, known as sacrificial film.

Where the chromium-containing film is an optical film like light-shielding film or a hard mask film, a high resolution and a high pattern transfer accuracy are required as well as the relevant optical functions. The chromium-containing film according to the invention meets optical functions including optical density and undergoes minimal side etching when a photomask pattern is formed therein by oxygen-containing chlorine base dry etching, typically such dry etching with a bias voltage applied to the substrate. Then, a mask pattern of satisfactory cross-sectional profile with a minimal variation of line width in thickness direction is obtainable.

In the embodiment wherein the chromium-containing film is disposed on an optical film on the substrate, the optical film may be a film having any function such as light-shielding film, antireflective film, or phase shift film, e.g., halftone phase shift film. The optical film encompasses an auxiliary processing film functioning as hard mask film (etching mask film) or etching stop film as long as after processing of the photomask blank to a photomask, it is left on the photomask and functions as an optical film. The optical film is preferably constructed so as to include a film of a silicon-containing, transition metal-free material or silicon and transition metal-containing material, for example, a phase shift film such as halftone phase shift film. In this case, the chromium-containing film and the phase shift film preferably have a total optical density of at least 2.5 with respect to exposure light.

On the chromium-containing film, a film of silicon-containing material such as hard mask film may be formed. In connection with processing of the photomask blank to a photomask, the etching stop film is typically a film which is left on the photomask whereas the hard mask film may be either a film which is left on the photomask or a film which is completely removed from the photomask, known as sacrificial film.

The materials of which the optical film and hard mask film are made may be selected from transition metals, metals, alloys thereof, and compounds of such metals or alloys, depending on necessary optical properties and etching properties, as well as electric properties such as conductivity.

Suitable transition metals include chromium (Cr), zirconium (Zr), tantalum (Ta), titanium (Ti), molybdenum (Mo), tungsten (W), iron (Fe), nickel (Ni) and cobalt (Co); suitable metals include silicon (Si), germanium (Ge) and aluminum (Al); and suitable compounds include oxides, nitrides, carbides, oxynitrides, oxycarbides, nitride carbides, and oxide nitride carbides of metals or alloys. Of the metals, chromium (Cr), molybdenum (Mo), and silicon (Si) are preferred.

The photomask blank of the invention is best suited as a photomask blank including a chromium-containing film which is patterned by oxygen-containing chlorine-base dry etching using a mask pattern of photoresist film (typically chemically amplified resist film) as an etching mask when the photomask blank is processed into a photomask.

A first embodiment of the inventive photomask blank is a photomask blank having a chromium-containing film disposed directly on a transparent substrate. FIG. 1 is a cross-sectional view of one exemplary photomask blank of the first embodiment. The photomask blank 101 includes a transparent substrate 1 and a chromium-containing film 2 thereon. Typically, the photomask blank 101 is processed into a photomask by forming a resist film for EB lithography on the chromium-containing film 2 and performing EB imagewise writing. The photomask blank of the first embodiment may be a binary mask blank, for example. In this case, it is preferred that the chromium-containing film be a light-shielding film.

In the first embodiment of the photomask blank, where the chromium-containing film is a light-shielding film, the chromium-containing film should preferably have an optical density of at least 2.5, more preferably at least 2.8 and up to 3.5, more preferably up to 3.2, with respect to the exposure light. In the first embodiment of the photomask blank, where the chromium-containing film is a light-shielding film, the chromium-containing film preferably has a thickness of up to 75 nm, more preferably up to 70 nm, and at least 50 nm when the exposure light is ArF excimer laser; or a thickness of up to 90 nm, more preferably up to 80 nm, and even more preferably up to 75 nm, and at least 55 nm when the exposure light is KrF excimer laser.

The photomask blank of the first embodiment may be processed into a phase shift mask by etching the transparent substrate through a pattern of the chromium-containing film as an etching mask, to form a phase shift portion.

A second embodiment of the inventive photomask blank including a chromium-containing film which is patterned by oxygen-containing chlorine-base dry etching using a mask pattern of photoresist film (typically chemically amplified resist film) as an etching mask when the photomask blank is processed into a photomask, is a photomask blank having a chromium-containing film disposed on a transparent substrate through one or more optical films. The photomask blank of the second embodiment is advantageous particularly when a pattern of the chromium-containing film functions as a hard mask in etching of the optical film, for example, because the pattern can be formed from the chromium-containing film at a high accuracy, and when the optical film is then patterned using the pattern of chromium-containing film, a pattern can also be formed at a high accuracy. Combinations of the chromium-containing film with the optical film include a combination of a light-shielding film with a phase shift film (e.g., halftone phase shift film) and a combination of a hard mask film with a light-shielding film.

Figure 2:
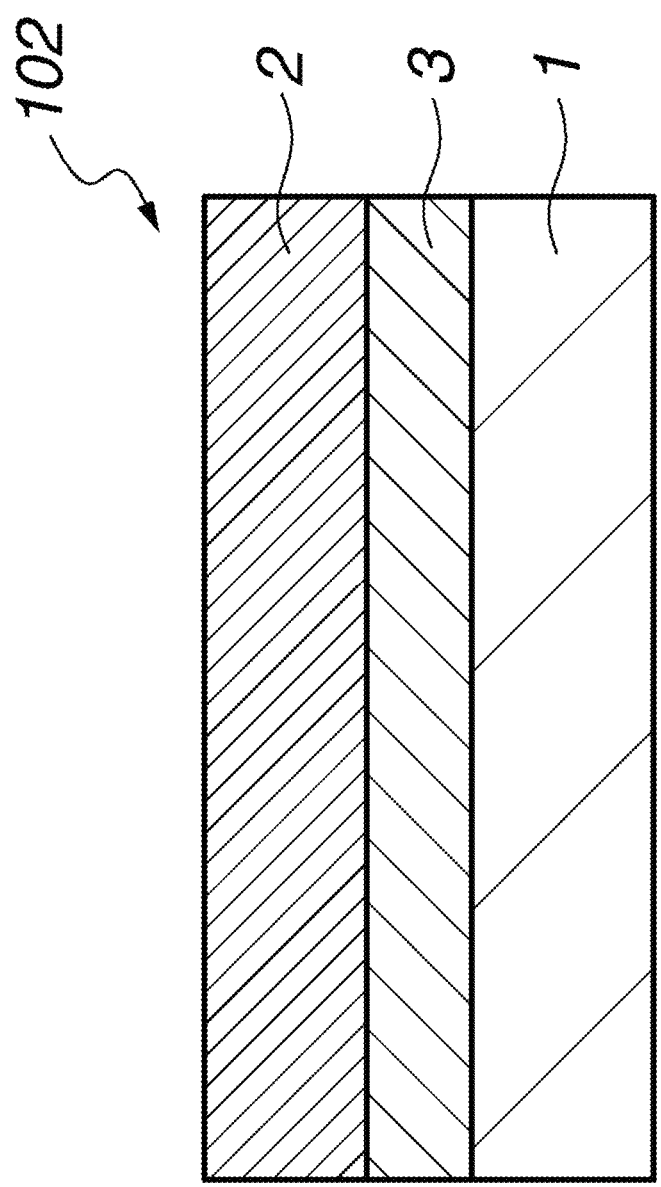
FIG. 2 is a cross-sectional view of a photomask blank in a second embodiment of the invention.

FIG. 2 is a cross-sectional view of one exemplary photomask blank of the second embodiment. The photomask blank 102 includes a transparent substrate 1, and an optical film 3 and a chromium-containing film 2 stacked thereon in order from the substrate 1 side. Typically, the photomask blank 102 is processed into a photomask by forming a resist film for EB lithography on the chromium-containing film 2 and performing EB imagewise writing. The photomask blank of the second embodiment may be a phase shift mask blank, for example. In this case, it is preferred that the optical film be a phase shift film and the chromium-containing film be a light-shielding film.

The inventive photomask blank is also preferred as a photomask blank including a chromium-containing film which is patterned by oxygen-containing chlorine-base dry etching using a mask pattern of hard mask film as an etching mask when the photomask blank is processed into a photomask. A third or fourth embodiment is a photomask blank including a transparent substrate, a chromium-containing film, and a hard mask film which is disposed on the side of the chromium-containing film remote from the substrate, preferably contiguous to the chromium-containing film.

Figure 3:
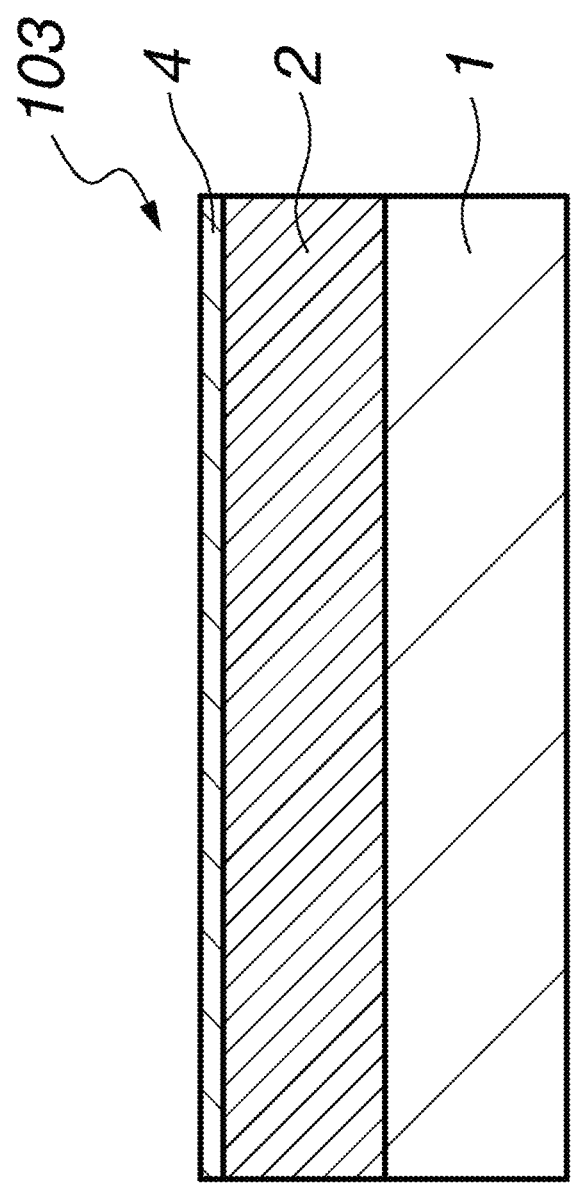
FIG. 3 is a cross-sectional view of a photomask blank in a third embodiment of the invention.

FIG. 3 is a cross-sectional view of one exemplary photomask blank of the third embodiment. The photomask blank 103 includes a transparent substrate 1, and a chromium-containing film 2 and a hard mask film 4 stacked in order from the substrate 1 side. Typically, the photomask blank 103 is processed into a photomask by forming a resist film for EB lithography on the hard mask film 4 and performing EB imagewise writing. With the pattern of EB resist film made an etching mask, the hard mask film 4 is patterned. Then with the hard mask film made an etching mask, the chromium-containing film is patterned. The photomask blank of the third embodiment may be a binary mask blank, for example. In this case, it is preferred that the chromium-containing film be a light-shielding film. After the chromium-containing film is patterned, the hard mask film may be partially or entirely removed, depending on necessity.

In the third embodiment of the photomask blank, where the chromium-containing film is a light-shielding film, the chromium-containing film should preferably have an optical density of at least 2.5, more preferably at least 2.8 and up to 3.5, more preferably up to 3.2, with respect to the exposure light. In the third embodiment of the photomask blank, where the chromium-containing film is a light-shielding film, the chromium-containing film preferably has a thickness of up to 75 nm, more preferably up to 70 nm, and at least 50 nm when the exposure light is ArF excimer laser; or a thickness of up to 90 nm, more preferably up to 80 nm, and even more preferably up to 75 nm, and at least 55 nm when the exposure light is KrF excimer laser.

The photomask blank of the third embodiment may be processed into a phase shift mask by etching the transparent substrate through a pattern of the chromium-containing film as an etching mask, to form a phase shift portion.

Figure 4:
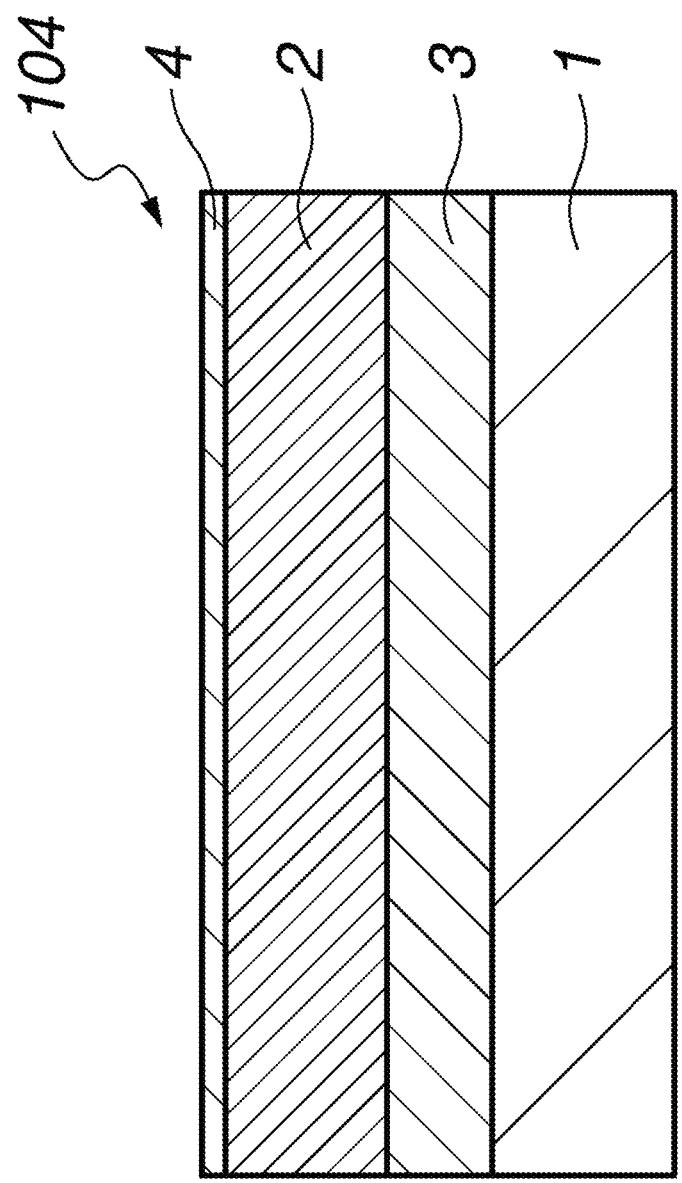
FIG. 4 is a cross-sectional view of a photomask blank in a fourth embodiment of the invention.

FIG. 4 is a cross-sectional view of one exemplary photomask blank of the fourth embodiment. The photomask blank 104 includes a transparent substrate 1, and an optical film 3, a chromium-containing film 2 and a hard mask film 4 stacked in order from the substrate 1 side. Typically, the photomask blank 104 is processed into a photomask by forming a resist film for EB lithography on the hard mask film 4 and performing EB imagewise writing. The photomask blank of the fourth embodiment may be a phase shift mask blank and in this case, it is preferred that the optical film be a phase shift film and the chromium-containing film be a light-shielding film.

Where the chromium-containing film is a film having optical function like light-shielding film, a high resolution and a high pattern transfer accuracy are required as well as the relevant optical functions. Then the chromium-containing film must meet optical functions including optical density, undergo minimal side etching during oxygen-containing chlorine base dry etching, and form a mask pattern with a high dimensional accuracy.

In the photomask blank of the second embodiment, where the optical film is a phase shift film, typically halftone phase shift film, the phase shift film is desirably formed of a material containing silicon, but not a transition metal, or a material containing silicon and a transition metal, preferably transition metal exclusive of chromium, especially molybdenum. Such materials include silicon alone, compounds containing silicon and a light element such as oxygen, nitrogen or carbon, especially one or both of oxygen and nitrogen, and such compounds having further added thereto a transition metal, preferably transition metal exclusive of chromium, specifically molybdenum, tantalum, tungsten, zirconium or titanium, especially molybdenum. Particularly when the phase shift film is a halftone phase shift film, the halftone phase shift film also has an optical density, which allows the thickness of the chromium-containing film to be reduced as compared with halftone phase shift film-free photomask blanks.

In the photomask blank of the second embodiment, where the chromium-containing film is a light-shielding film and the optical film is a halftone phase shift film, the chromium-containing film preferably has an optical density of at least 1.5, more preferably at least 1.8 and up to 2.6, more preferably up to 2.5, and even more preferably up to 2.4, with respect to the exposure light. The sum of optical densities of the chromium-containing film and phase shift film with respect to the exposure light is preferably at least 2.5, more preferably at least 2.8 and up to 3.5, more preferably up to 3.2. The desired light-shielding properties are obtained by adjusting the optical density of the chromium-containing film and the halftone phase shift film to the range.

In the second embodiment of the photomask blank, where the chromium-containing film is a light-shielding film and the optical film is a halftone phase shift film, the chromium-containing film preferably has a thickness of up to 60 nm, more preferably up to 50 nm, and at least 35 nm when the exposure light is ArF excimer laser; or a thickness of up to 80 nm, more preferably up to 70 nm, and even more preferably up to 65 nm, and at least 50 nm when the exposure light is KrF excimer laser.

On the other hand, the halftone phase shift film is set to a transmittance of preferably at least 2%, more preferably at least 5%, even more preferably at least 10%, most preferably at least 11% and up to 40%, more preferably up to 30%, even more preferably up to 20% with respect to the exposure light. The halftone phase shift film preferably has a thickness of up to 80 nm, more preferably up to 70 nm, and at least 50 nm, more preferably at least 60 nm when the exposure light is ArF excimer laser; or a thickness of up to 110 nm, more preferably up to 100 nm, and at least 70 nm, more preferably at least 80 nm when the exposure light is KrF excimer laser.

As in the third embodiment of the photomask blank, a hard mask film is provided as a hard mask serving in etching of the chromium-containing film, which allows the photoresist film to be thinned to comply with further pattern miniaturization. This hard mask film is typically used as a sacrificial film for the chromium-containing film. Most often, the hard mask film is completely removed in the photomask fabrication process. Sometimes, the hard mask film may be left in part, without complete removal, in the photomask fabrication process.

The hard mask film may be formed of a material which is quickly etched on fluorine-base dry etching, but has an extremely slow etching rate (i.e., is not substantially etched) on oxygen-containing chlorine-base dry etching. Suitable materials are silicon-containing materials, for example, silicon alone, compounds containing silicon and a light element such as oxygen, nitrogen or carbon, and such compounds having further added thereto a transition metal, preferably transition metal exclusive of chromium, specifically molybdenum, tantalum, tungsten, zirconium or titanium.

In the fourth embodiment of the photomask blank, where the optical film is a phase shift film, typically halftone phase shift film, the phase shift film is preferably formed of a material containing silicon, but not a transition metal, or a material containing silicon and a transition metal, preferably transition metal exclusive of chromium, especially molybdenum. Suitable materials are as exemplified above for the second embodiment of the photomask blank. Particularly when the phase shift film is a halftone phase shift film, the halftone phase shift film also has an optical density, which allows the thickness of the chromium-containing film to be reduced as compared with halftone phase shift film-free photomask blanks.

In the fourth embodiment of the photomask blank, where the chromium-containing film is a light-shielding film, and the optical film is a halftone phase shift film, the optical density of the chromium-containing film with respect to exposure light, the sum of optical densities of the chromium-containing film and phase shift film with respect to exposure light, the thickness of the chromium-containing film, the transmittance of the halftone phase shift film, and the thickness of the halftone phase shift film preferably fall in the same ranges as in the second embodiment.

In the fourth embodiment of the photomask blank, where the chromium-containing film is a light-shielding film, the optical film is a halftone phase shift film, and the hard mask film is a film to be left in part, without complete removal, in the photomask fabrication process, i.e., a film to be left on a photomask and to function as an optical film, the sum of optical densities of the chromium-containing film, phase shift film and hard mask film with respect to the exposure light is preferably at least 2.5, more preferably at least 2.8 and up to 3.5, more preferably up to 3.2. The hard mask film has a thickness of preferably at least 3 nm, more preferably at least 5 nm and up to 15 nm, more preferably up to 10 nm.

In another example of the second embodiment, the photomask blank may be a binary mask blank. In this case, preferably the optical film is a light-shielding film and the chromium-containing film is a hard mask film.

In the second embodiment of the photomask blank, where the chromium-containing film is a hard mask film, the film must have a high resolution and high pattern transfer accuracy as well as the optical functions. In this sense, the chromium-containing film must meet the desired optical functions, have a high etching rate in oxygen-containing chlorine-base dry etching, and form a mask pattern of improved cross-sectional profile having a minimal line width variation in thickness direction.

In the second embodiment of the photomask blank, where the optical film is a light-shielding film, the light-shielding film is preferably made of a material containing silicon, but not a transition metal, or a material containing silicone and a transition metal, preferably transition metal exclusive of chromium, typically molybdenum. Suitable materials are the same as exemplified above for the material of the phase shift film.

In the photomask blank of the second embodiment, where the optical film is a light-shielding film, the light-shielding film is set to an optical density of at least 2.5, more preferably at least 2.8 and up to 3.5, more preferably up to 3.2, with respect to the exposure light. The light-shielding film preferably has a thickness of up to 80 nm, more preferably up to 70 nm, and even more preferably up to 65 nm, and at least 50 nm, more preferably at least 55 nm when the exposure light is ArF excimer laser; or a thickness of up to 100 nm, more preferably up to 90 nm, and even more preferably up to 80 nm, and at least 55 nm, more preferably at least 60 nm when the exposure light is KrF excimer laser. Where the chromium-containing film is a hard mask film, it preferably has a thickness of at least 3 nm, more preferably at least 5 nm and up to 20 nm, more preferably up to 10 nm.

In a further embodiment of the photomask blank, another optical film may be formed on the surface of the chromium-containing film disposed remote from the transparent substrate, preferably contiguous to the chromium-containing film. The other optical film is preferably a light-shielding film, for example, formed of a material containing silicon, but not a transition metal or a material containing silicon and a transition metal. Where such a light-shielding film is incorporated, the chromium-containing film may be an etching stop film or a phase shift film such as halftone phase shift film.

The preferred method for depositing a chromium-containing film, an optical film (e.g., phase shift film or light-shielding film) and an auxiliary processing film (e.g., hard mask film or etching stop film) on a photomask blank is film deposition by sputtering because a film having high in-plane uniformity of optical properties and less defects is available.

The chromium-containing film is deposited by sputtering. For example, a chromium target is used as the target. The sputtering gas is selected from such reactive gases as nitrogen gas ($N_2$), oxygen gas ($O_2$), nitrogen oxide gas ($N_2O$, $NO_2$), hydrocarbon gas (e.g., $CH_4$), and carbon oxide gas (CO, $CO_2$) in accordance with the desired constitutional elements. A rare gas such as argon gas (Ar) is optionally used along with the reactive gas. Film deposition may be performed by feeding the sputtering gas into a sputtering vacuum chamber, and adjusting the power applied to the target and the flow rate of sputtering gas such that each of chromium compound layers to constitute the chromium-containing film may have the desired composition.

When a phase shift film or light-shielding film is deposited from a material containing silicon, but not a transition metal or a material containing silicon and a transition metal, or when a hard mask film is deposited from a silicon-containing material, for example, the target is selected from silicon target, transition metal target, and transition metal-silicon target in accordance with the desired constitutional elements. The sputtering gas is selected from such reactive gases as nitrogen gas ($N_2$), oxygen gas ($O_2$), nitrogen oxide gas ($N_2O$, $NO_2$), hydrocarbon gas (e.g., $CH_4$), and carbon oxide gas (CO, $CO_2$) in accordance with the desired constitutional elements. A rare gas such as argon gas (Ar) is optionally used along with the reactive gas. Film deposition may be performed by feeding the sputtering gas into a sputtering vacuum chamber, and adjusting the power applied to the target and the flow rate of sputtering gas so as to form a film of the desired composition.

A photomask may be produced from the photomask blank by the standard method. For example, a resist film of chemically amplified resist composition is formed on the photomask blank, followed by patternwise EB writing. Using the resist pattern as an initial etching mask, the underlying films including chromium-containing film, optical film (e.g., phase shift film, light-shielding film), auxiliary processing film (e.g., hard mask film, etching stop film) and transparent substrate are etched in sequence by a dry etching technique which is selected from oxygen-containing chlorine-base dry etching and fluorine-base dry etching in accordance with the material to be etched. In this way, a photomask pattern is formed, i.e., a photomask is obtained. The method for producing a photomask from the photomask blank according to the invention involves the step of patterning the chromium-containing film by oxygen-containing chlorine base dry etching. When the chromium-containing film is processed by dry etching, the resulting pattern is of cross-sectional profile which is fully perpendicular as obtained from anisotropic dry etching. It is noted that an organic conductive film may be formed on the resist film for further suppressing the charge buildup during EB writing.

EXAMPLE

Examples and Comparative Examples are given below by way of illustration and not by way of limitation.

Example 1

In a DC sputtering system, sputter deposition was carried out on a 6025 quartz substrate by using a silicon target as the target, feeding argon gas at a flow rate of 17 sccm and nitrogen gas at a flow rate of 40 sccm as the sputtering gas, and applying a discharge power of 1,900 W across the target. A SiN film having an atomic ratio of Si:N=47:53 and a thickness of 60 nm was deposited on the substrate as a halftone phase shift film. The film had a phase shift of 177°, a transmittance of 19%, and an optical density (OD) of 0.72 at 193 nm, the wavelength of ArF excimer laser.

In the DC sputtering system, sputter deposition was carried out on the SiN film by using a metallic chromium target, feeding 10 sccm of argon gas, 15 sccm of carbon dioxide gas, and 5 sccm of methane gas as the sputtering gas, and applying a discharge power of 1,000 W across the target to conduct discharge for 600 seconds. A single CrOC layer was deposited as a chromium-containing film on the halftone phase shift film.

The chromium-containing film had a thickness of 57 nm and was analyzed for composition by X-ray photoelectron spectroscopy (XPS), finding an atomic ratio of Cr:O:C=47:24:29. The film had a transmittance of 0.43% and an optical density (OD) of 2.37 at wavelength 193 nm. The sum of ODs of halftone phase shift film and chromium-containing film was 3.09. Separately, a chromium-containing film was deposited by the same procedure as above and analyzed for surface roughness under atomic force microscope (AFM), finding satisfactory roughness values, a root mean square roughness (RMS) of 0.63 nm and a maximum height difference (Rmax) of 4.7 nm in an area of 1 µm squares. It was confirmed that the film causes neither diffuse reflection nor a lowering of inspection sensitivity even when sensitivity is increased during defect inspection.

Next, in the DC sputtering system, sputter deposition was carried out on the chromium-containing film by using a silicon target, feeding 15 sccm of argon gas and 40 sccm of oxygen gas as the sputtering gas, and applying a discharge power of 1,000 W across the target. A $SiO_2$ film of 10 nm thick was deposited as a hard mask film on the chromium-containing film. There was obtained a photomask blank (halftone phase shift photomask blank) having an optical film, chromium-containing film and hard mask film formed sequentially on the transparent substrate according to the fourth embodiment.

From the photomask blank, a photomask was produced by patterning as follows. First, a chemically amplified negative photoresist film for EB lithography was coated on the hard mask film, exposed imagewise to EB, and developed, forming a pattern of resist film having a line width of 200 nm. Using the resist film pattern as an etching mask, the hard mask film was dry etched with fluorine base gas. A pattern of the hard mask film was formed.

Figure 5:
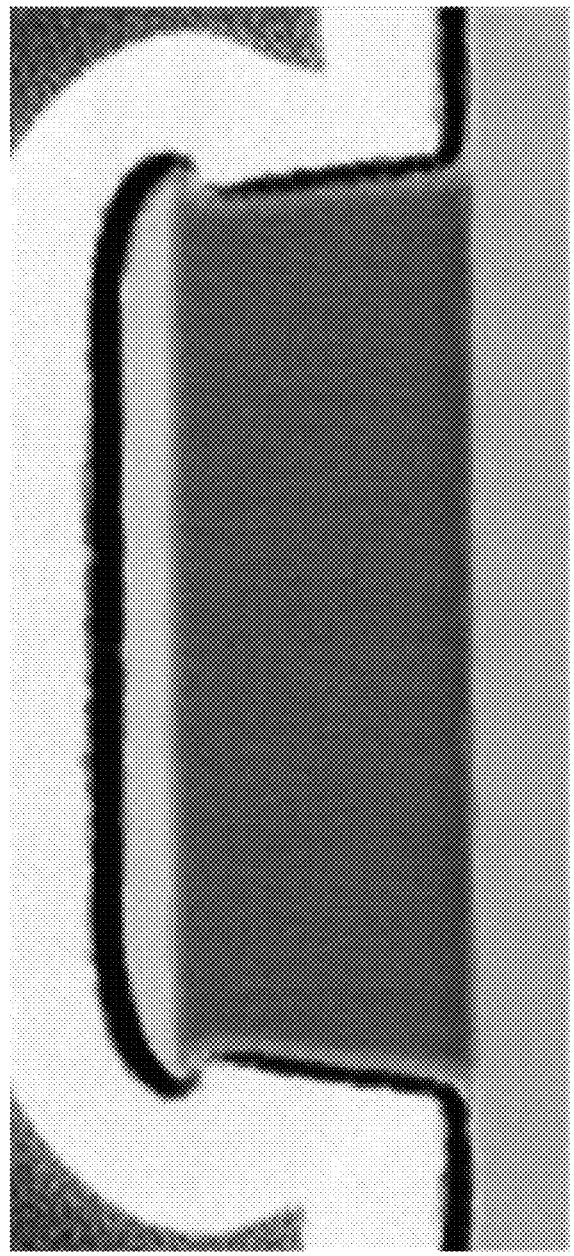
FIG. 5 is a TEM image in cross section of a 200-nm L/S pattern of a chromium-containing film in Example 1.

The resist film pattern left on the hard mask film pattern was removed by sulfuric acid-hydrogen peroxide cleaning. Using the hard mask film pattern as an etching mask, the chromium-containing film was dry etched with chlorine gas and oxygen gas. A pattern of the chromium-containing film was formed. A cross section of a chromium-containing film pattern (separately formed by the same procedure) was observed under TEM. FIG. 5 is a cross-sectional image of a 200-nm line and space (L/S) pattern. It was confirmed that the chromium-containing film pattern was formed as having substantially the same line width as the hard mask film pattern, side etching was suppressed, and the cross sectional profile was fully perpendicular.

Next, by fluorine base gas dry etching, the hard mask film pattern on the chromium-containing film pattern was removed. At the same time, the halftone phase shift film was etched while the chromium-containing film pattern served as an etching mask. A pattern of the halftone phase shift film was thus formed.

Next, a chemically amplified negative photoresist film for EB lithography was coated, exposed imagewise to EB, and developed, forming a pattern of resist film so that a portion where the chromium-containing film pattern was to be removed might be exposed. By dry etching with chlorine gas and oxygen gas, the predetermined portion of the chromium-containing film pattern was removed, yielding a photomask (halftone phase shift mask).

The pattern of the halftone phase shift film of the photomask was examined for line width. The halftone phase shift film pattern had a line width of 200 nm, indicating a satisfactory dimensional accuracy.

Example 2

In a DC sputtering system, sputter deposition was carried out on a 6025 quartz substrate by using a silicon target as the target, feeding argon gas at a flow rate of 17 sccm and nitrogen gas at a flow rate of 40 sccm as the sputtering gas, and applying a discharge power of 1,900 W across the target. A SiN film having an atomic ratio of Si:N=47:53 and a thickness of 60 nm was deposited on the substrate as a halftone phase shift film. The film had a phase shift of 177°, a transmittance of 19%, and an optical density (OD) of 0.72 at 193 nm, the wavelength of ArF excimer laser.

In the DC sputtering system, sputter deposition was carried out on the SiN film by using a metallic chromium target, feeding 10 sccm of argon gas, 15 sccm of carbon dioxide gas, and 5 sccm of methane gas as the sputtering gas, and applying a discharge power of 1,000 W across the target to conduct discharge for 550 seconds. A CrOC layer of 52 nm thick was deposited. Continuously following the formation of the CrOC layer, sputter deposition was carried out by feeding 10 sccm of argon gas, 27 sccm of nitrogen gas, and 15 sccm of oxygen gas, and applying a discharge power of 1,000 W across the target to conduct discharge for 62 seconds. A CrON layer of 5 nm thick was deposited. In this way, a chromium-containing film consisting of two layers, CrOC layer and CrON layer was formed on the halftone phase shift film.

The chromium-containing film had a total thickness of 57 nm and was analyzed for composition by XPS, finding an atomic ratio of Cr:O:C=47:24:29 for the CrOC layer and Cr:O:N=41:49:10 for the CrON layer. The film had a transmittance of 0.46% and an optical density (OD) of 2.34 at wavelength 193 nm. The sum of ODs of halftone phase shift film and chromium-containing film was 3.06. Separately, a chromium-containing film was deposited by the same procedure as above and analyzed for surface roughness under AFM, finding satisfactory roughness values, a RMS of 0.50 nm and a Rmax of 4.3 nm in an area of 1 µm squares. It was confirmed that the film causes neither diffuse reflection nor a lowering of inspection sensitivity even when sensitivity is increased during defect inspection.

Next, in the DC sputtering system, sputter deposition was carried out on the chromium-containing film by using a silicon target, feeding 15 sccm of argon gas and 40 sccm of oxygen gas as the sputtering gas, and applying a discharge power of 1,000 W across the target. A $SiO_2$ film of 10 nm thick was deposited as a hard mask film on the chromium-containing film. There was obtained a photomask blank (halftone phase shift photomask blank) having an optical film, chromium-containing film and hard mask film formed sequentially on the transparent substrate according to the fourth embodiment.

From the photomask blank, a photomask was produced by patterning as follows. First, a chemically amplified negative photoresist film for EB lithography was coated on the hard mask film, exposed imagewise to EB, and developed, forming a pattern of resist film having a line width of 200 nm. Using the resist film pattern as an etching mask, the hard mask film was dry etched with fluorine base gas. A pattern of the hard mask film was formed.

Figure 6:
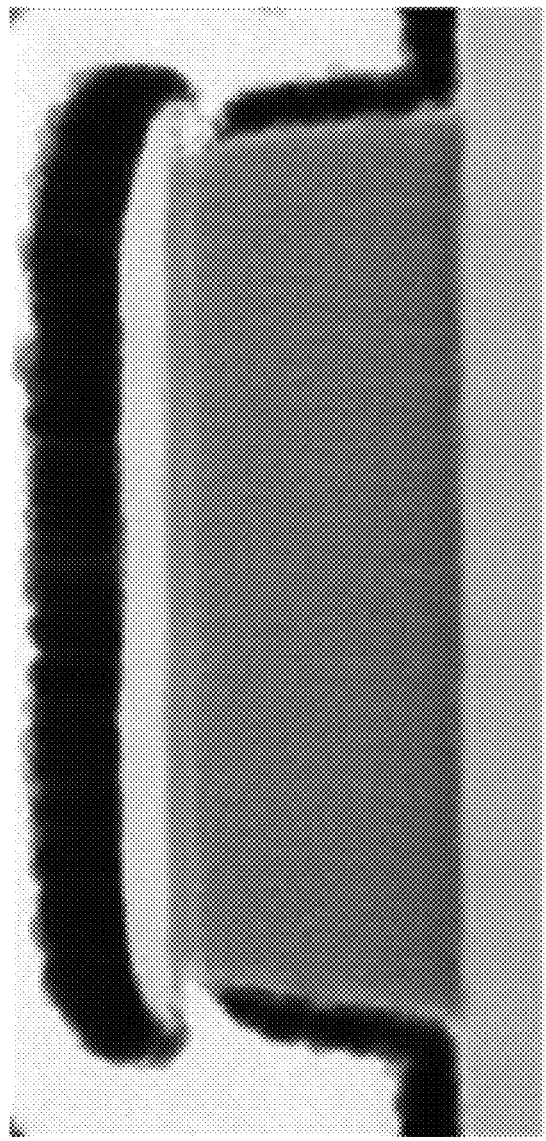
FIG. 6 is a TEM image in cross section of a 200-nm L/S pattern of a chromium-containing film in Example 2.

The resist film pattern left on the hard mask film pattern was removed by sulfuric acid-hydrogen peroxide cleaning. Using the hard mask film pattern as an etching mask, the chromium-containing film was dry etched with chlorine gas and oxygen gas. A pattern of the chromium-containing film was formed. A cross section of a chromium-containing film pattern (separately formed by the same procedure) was observed under TEM. FIG. 6 is a cross-sectional image of a 200-nm L/S pattern. It was confirmed that the chromium-containing film pattern was formed as having substantially the same line width as the hard mask film pattern, side etching was suppressed, and the cross sectional profile was fully perpendicular.

Next, by fluorine base gas dry etching, the hard mask film pattern on the chromium-containing film pattern was removed. At the same time, the halftone phase shift film was etched while the chromium-containing film pattern served as an etching mask. A pattern of the halftone phase shift film was thus formed.

Next, a chemically amplified negative photoresist film for EB lithography was coated, exposed imagewise to EB, and developed, forming a pattern of resist film so that a portion where the chromium-containing film pattern was to be removed might be exposed. By dry etching with chlorine gas and oxygen gas, the predetermined portion of the chromium-containing film pattern was removed, yielding a photomask (halftone phase shift mask).

The pattern of the halftone phase shift film of the photomask was examined for line width. The halftone phase shift film pattern had a line width of 200 nm, indicating a satisfactory dimensional accuracy.

Example 3

In a DC sputtering system, sputter deposition was carried out on a 6025 quartz substrate by using a silicon target as the target, feeding argon gas at a flow rate of 17 sccm and nitrogen gas at a flow rate of 40 sccm as the sputtering gas, and applying a discharge power of 1,900 W across the target. A SiN film having an atomic ratio of Si:N=47:53 and a thickness of 60 nm was deposited on the substrate as a halftone phase shift film. The film had a phase shift of 177°, a transmittance of 19%, and an optical density (OD) of 0.72 at 193 nm, the wavelength of ArF excimer laser.

In the DC sputtering system, sputter deposition was carried out on the SiN film by using a metallic chromium target, feeding 10 sccm of argon gas, 15 sccm of carbon dioxide gas, and 5 sccm of methane gas as the sputtering gas, and applying a discharge power of 1,000 W across the target to conduct discharge for 594 seconds. A CrOC layer of 56 nm thick was deposited. Continuously following the formation of the CrOC layer, sputter deposition was carried out by feeding 10 sccm of argon gas, 27 sccm of nitrogen gas, and 15 sccm of oxygen gas, and applying a discharge power of 1,000 W across the target to conduct discharge for 22 seconds. A CrON layer of 2 nm thick was formed. In this way, a chromium-containing film consisting of two layers, CrOC layer and CrON layer was formed on the halftone phase shift film.

The chromium-containing film had a total thickness of 58 nm and was analyzed for composition by XPS, finding an atomic ratio of Cr:O:C=47:24:29 for the CrOC layer and Cr:O:N=41:49:10 for the CrON layer. The film had a transmittance of 0.42% and an optical density (OD) of 2.38 at wavelength 193 nm. The sum of ODs of halftone phase shift film and chromium-containing film was 3.10. Separately, a chromium-containing film was deposited by the same procedure as above and analyzed for surface roughness under AFM, finding satisfactory roughness values, a RMS of 0.46 nm and a Rmax of 4.1 nm in an area of 1 μm squares. It was confirmed that the film causes neither diffuse reflection nor a lowering of inspection sensitivity even when sensitivity is increased during defect inspection.

Next, in the DC sputtering system, sputter deposition was carried out on the chromium-containing film by using a silicon target, feeding 15 sccm of argon gas and 40 sccm of oxygen gas as the sputtering gas, and applying a discharge power of 1,000 W across the target. A $SiO_2$ film of 10 nm thick was deposited as a hard mask film on the chromium-containing film. There was obtained a photomask blank (halftone phase shift photomask blank) having an optical film, chromium-containing film and hard mask film formed sequentially on the transparent substrate according to the fourth embodiment.

From the photomask blank, a photomask was produced by patterning as follows. First, a chemically amplified negative photoresist film for EB lithography was coated on the hard mask film, exposed imagewise to EB, and developed, forming a pattern of resist film having a line width of 200 nm. Using the resist film pattern as an etching mask, the hard mask film was dry etched with fluorine base gas. A pattern of the hard mask film was formed.

Figure 7:
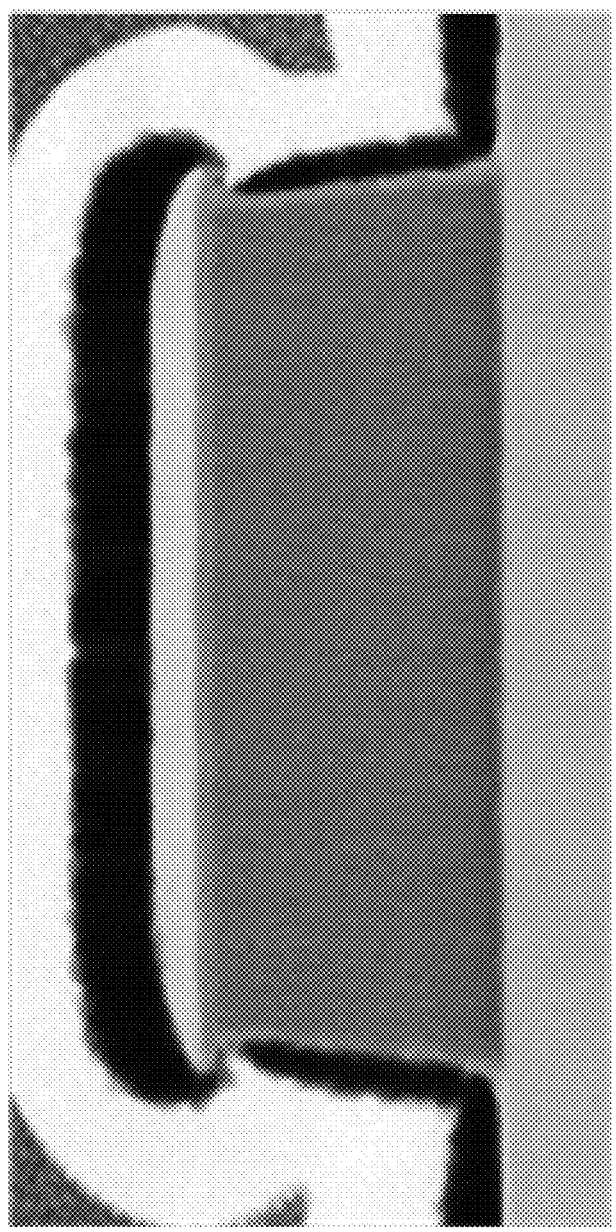
FIG. 7 is a TEM image in cross section of a 200-nm L/S pattern of a chromium-containing film in Example 3.

The resist film pattern left on the hard mask film pattern was removed by sulfuric acid-hydrogen peroxide cleaning. Using the hard mask film pattern as an etching mask, the chromium-containing film was dry etched with chlorine gas and oxygen gas. A pattern of the chromium-containing film was formed. A cross section of a chromium-containing film pattern (separately formed by the same procedure) was observed under TEM. FIG. 7 is a cross-sectional image of a 200-nm L/S pattern. It was confirmed that the chromium-containing film pattern was formed as having substantially the same line width as the hard mask film pattern, side etching was suppressed, and the cross sectional profile was fully perpendicular.

Next, by fluorine base gas dry etching, the hard mask film pattern on the chromium-containing film pattern was removed. At the same time, the halftone phase shift film was etched while the chromium-containing film pattern served as an etching mask. A pattern of the halftone phase shift film was thus formed.

Next, a chemically amplified negative photoresist film for EB lithography was coated, exposed imagewise to EB, and developed, forming a pattern of resist film so that a portion where the chromium-containing film pattern was to be removed might be exposed. By dry etching with chlorine gas and oxygen gas, the predetermined portion of the chromium-containing film pattern was removed, yielding a photomask (halftone phase shift mask).

The pattern of the halftone phase shift film of the photomask was examined for line width. The halftone phase shift film pattern had a line width of 200 nm, indicating a satisfactory dimensional accuracy.

Comparative Example 1

In a DC sputtering system, sputter deposition was carried out on a 6025 quartz substrate by using a silicon target as the target, feeding argon gas at a flow rate of 17 sccm and nitrogen gas at a flow rate of 40 sccm as the sputtering gas, and applying a discharge power of 1,900 W across the target. A SiN film having an atomic ratio of Si:N=47:53 and a thickness of 60 nm was deposited on the substrate as a halftone phase shift film. The film had a phase shift of 177°, a transmittance of 19%, and an optical density (OD) of 0.72 at 193 nm, the wavelength of ArF excimer laser.

In the DC sputtering system, sputter deposition was carried out on the SiN film by using a metallic chromium target, feeding 10 sccm of argon gas and 20 sccm of carbon dioxide gas as the sputtering gas, and applying a discharge power of 1,000 W across the target to conduct discharge for 400 seconds. A single CrOC layer was deposited as a chromium-containing film on the halftone phase shift film.

The chromium-containing film had a thickness of 49 nm and was analyzed for composition by XPS, finding an atomic ratio of Cr:O:C=57:22:21. The film had a transmittance of 0.41% and an optical density (OD) of 2.39 at wavelength 193 nm. The sum of ODs of halftone phase shift film and chromium-containing film was 3.11. Separately, a chromium-containing film was deposited by the same procedure as above and analyzed for surface roughness under AFM, finding a RMS of 1.29 nm and a Rmax of 9.22 nm in an area of 1 μm squares. The surface roughness of the film caused diffuse reflection when sensitivity was increased during defect inspection. The film prevented any increase of inspection sensitivity.

Next, in the DC sputtering system, sputter deposition was carried out on the chromium-containing film by using a silicon target, feeding 15 sccm of Ar gas and 40 sccm of oxygen gas as the sputtering gas, and applying a discharge power of 1,000 W across the target. A $SiO_2$ film of 10 nm thick was deposited as a hard mask film on the chromium-containing film. There was obtained a photomask blank (halftone phase shift photomask blank) having an optical film, chromium-containing film and hard mask film formed sequentially on the transparent substrate (according to the fourth embodiment).

From the photomask blank, a photomask was produced by patterning as follows. First, a chemically amplified negative photoresist film for EB lithography was coated on the hard mask film, exposed imagewise to EB, and developed, forming a pattern of resist film having a line width of 200 nm. Using the resist film pattern as an etching mask, the hard mask film was dry etched with fluorine base gas. A pattern of the hard mask film was formed.

Figure 8:
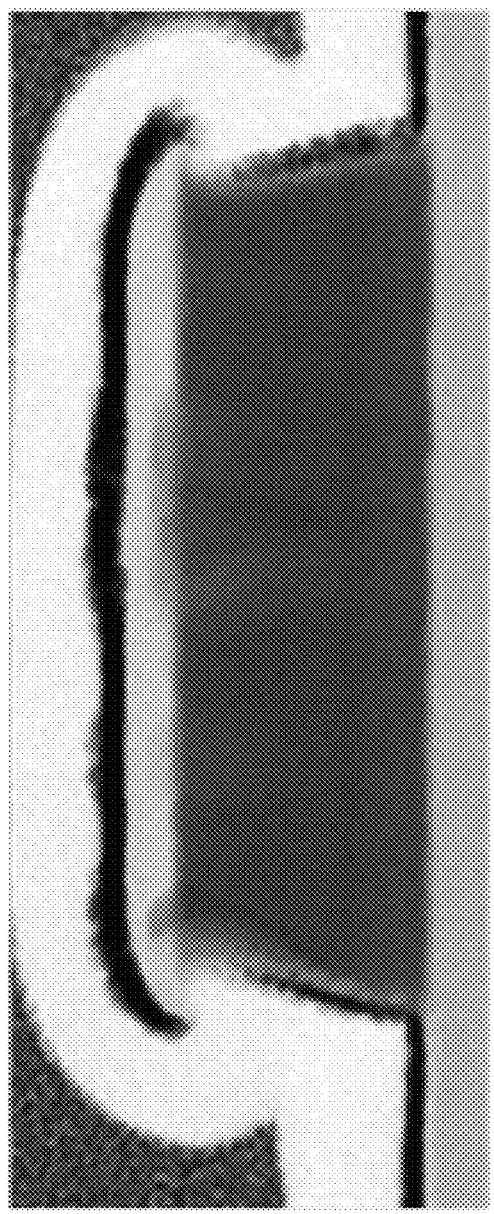
FIG. 8 is a TEM image in cross section of a 200-nm L/S pattern of a chromium-containing film in Comparative Example 1.

The resist film pattern left on the hard mask film pattern was removed by sulfuric acid-hydrogen peroxide cleaning. Using the hard mask film pattern as an etching mask, the chromium-containing film was dry etched with chlorine gas and oxygen gas. A pattern of the chromium-containing film was formed. A cross section of a chromium-containing film pattern (separately formed by the same procedure) was observed under TEM. FIG. 8 is a cross-sectional image of a 200-nm L/S pattern. It was confirmed that the chromium-containing film pattern was formed as having a smaller line width than the hard mask film pattern. Specifically, the chromium-containing film pattern had a tapered profile that the width of the pattern on the hard mask film side was small and the width of the pattern increased toward the substrate side. The width of the chromium-containing film pattern on the substrate side was substantially equal to the width of the hard mask film pattern. Further, the chromium-containing film included protruding portions in its surface, indicating a roughened surface.

Next, by fluorine base gas dry etching, the hard mask film pattern on the chromium-containing film pattern was removed. At the same time, the halftone phase shift film was etched while the chromium-containing film pattern served as an etching mask. A pattern of the halftone phase shift film was thus formed.

Next, a chemically amplified negative photoresist film for EB lithography was coated, exposed imagewise to EB, and developed, forming a pattern of resist film so that a portion where the chromium-containing film pattern was to be removed might be exposed. By dry etching with chlorine gas and oxygen gas, the predetermined portion of the chromium-containing film pattern was removed, yielding a photomask (halftone phase shift mask).

The pattern of the halftone phase shift film of the photomask was examined for line width. The halftone phase shift film pattern had a line width of 200 nm, indicating a satisfactory dimensional accuracy. However, the surface roughness caused a drop of defect inspection sensitivity. Therefore, this photomask blank was not suited as the advanced photomask blank.

Comparative Example 2

In a DC sputtering system, sputter deposition was carried out on a 6025 quartz substrate by using a silicon target as the target, feeding argon gas at a flow rate of 17 sccm and nitrogen gas at a flow rate of 40 sccm as the sputtering gas, and applying a discharge power of 1,900 W across the target. A SiN film having an atomic ratio of Si:N=47:53 and a thickness of 60 nm was deposited on the substrate as a halftone phase shift film. The film had a phase shift of 177°, a transmittance of 19%, and an optical density (OD) of 0.72 at 193 nm, the wavelength of ArF excimer laser.

In the DC sputtering system, sputter deposition was carried out on the SiN film by using a metallic chromium target, feeding 10 sccm of argon gas, 5 sccm of carbon dioxide gas, and 15 sccm of oxygen gas as the sputtering gas, and applying a discharge power of 1,000 W across the target to conduct discharge for 262 seconds. A single CrOC layer was deposited as a chromium-containing film on the halftone phase shift film.

The chromium-containing film had a thickness of 49 nm and was analyzed for composition by XPS, finding an atomic ratio of Cr:O:C=62:30:8. The film had a transmittance of 0.43% and an optical density (OD) of 2.37 at wavelength 193 nm. The sum of ODs of halftone phase shift film and chromium-containing film was 3.09. Separately, a chromium-containing film was deposited by the same procedure as above and analyzed for surface roughness under AFM, finding a RMS of 0.36 nm and a Rmax of 7.86 nm in an area of 1 μm squares. It was confirmed that the film causes neither diffuse reflection nor a lowering of inspection sensitivity even when sensitivity is increased during defect inspection.

Next, in the DC sputtering system, sputter deposition was carried out on the chromium-containing film by using a silicon target, feeding 15 sccm of argon gas and 40 sccm of oxygen gas as the sputtering gas, and applying a discharge power of 1,000 W across the target. A $SiO_2$ film of 10 nm thick was deposited as a hard mask film on the chromium-containing film. There was obtained a photomask blank (halftone phase shift photomask blank) having an optical film, chromium-containing film and hard mask film formed sequentially on the transparent substrate (according to the fourth embodiment).

From the photomask blank, a photomask was produced by patterning as follows. First, a chemically amplified negative photoresist film for EB lithography was coated on the hard mask film, exposed imagewise to EB, and developed, forming a pattern of resist film having a line width of 200 nm. Using the resist film pattern as an etching mask, the hard mask film was dry etched with fluorine base gas. A pattern of the hard mask film was formed.

Figure 9:
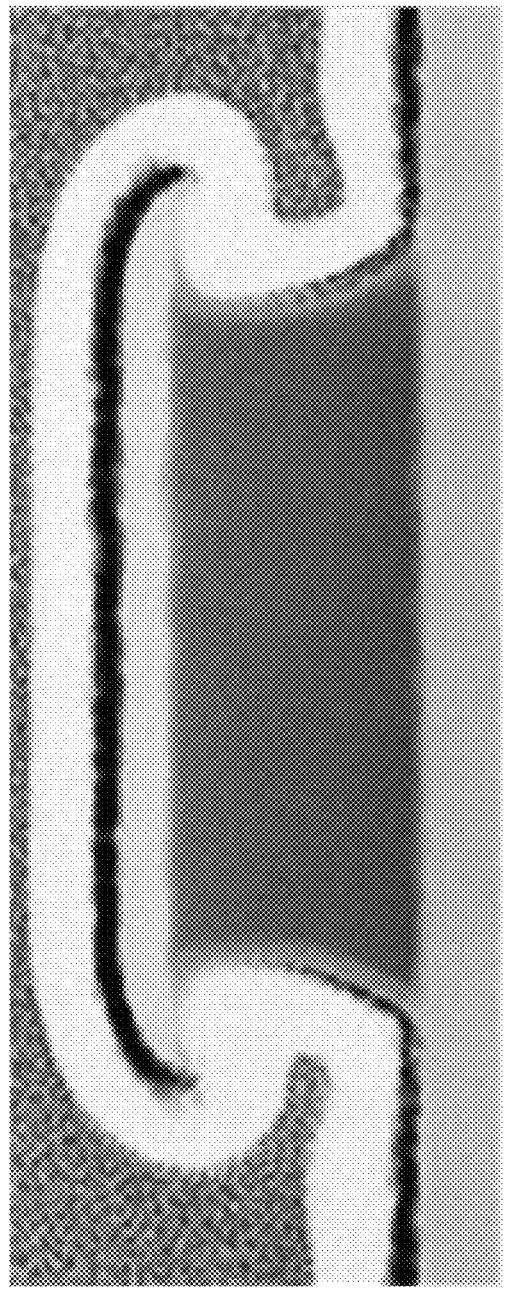
FIG. 9 is a TEM image in cross section of a 200-nm L/S pattern of a chromium-containing film in Comparative Example 2.

The resist film pattern left on the hard mask film pattern was removed by sulfuric acid-hydrogen peroxide cleaning. Using the hard mask film pattern as an etching mask, the chromium-containing film was dry etched with chlorine gas and oxygen gas. A pattern of the chromium-containing film was formed. A cross section of a chromium-containing film pattern (separately formed by the same procedure) was observed under TEM. FIG. 9 is a cross-sectional image of a 200-nm L/S pattern. It was confirmed that the chromium-containing film pattern was formed as having a smaller line width than the hard mask film pattern. Specifically, the chromium-containing film pattern had a tapered profile that the width of the pattern on the hard mask film side was small and the width of the pattern increased toward the substrate side, indicating substantial side etching of the chromium-containing film.

Next, fluorine base gas dry etching was carried out to remove the hard mask film pattern on the chromium-containing film pattern. At the same time, the halftone phase shift film was etched while the chromium-containing film pattern served as an etching mask. A pattern of the halftone phase shift film was thus formed.

Next, a chemically amplified negative photoresist film for EB lithography was coated, exposed imagewise to EB, and developed, forming a pattern of resist film so that a portion where the chromium-containing film pattern was to be removed might be exposed. By dry etching with chlorine gas and oxygen gas, the predetermined portion of the chromium-containing film pattern was removed, yielding a photomask (halftone phase shift mask).

The pattern of the halftone phase shift film of the photomask was examined for line width. The halftone phase shift film pattern had a line width deviating from 200 nm, indicating a poor dimensional accuracy.

Japanese Patent Application No. 2017-218156 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A photomask blank which is processed into a photomask suitable for pattern transfer using exposure light of wavelength up to 250 nm, comprising a transparent substrate and a chromium-containing film which is disposed on the substrate directly or through an optical film and dry etchable with oxygen-containing chlorine based gas, wherein said chromium-containing film is constructed by a single layer or multiple layers, the single layer or at least one of the multiple layers is a layer which is composed of a carbon-containing chromium compound and further contains oxygen or oxygen and nitrogen, said layer composed of a carbon-containing chromium compound and further containing oxygen or oxygen and nitrogen has a composition having an atomic ratio of carbon to chromium of at least 0.3 and an atomic ratio of nitrogen to chromium of up to 0.1, and having a chromium content of up to 50 at % and an atomic ratio of carbon to oxygen of at least 0.8, or a chromium content of up to 60 at % and an atomic ratio of carbon to oxygen of at least 1.

2. The photomask blank of claim 1 wherein said layer composed of a carbon-containing chromium compound and further containing oxygen or oxygen and nitrogen has an oxygen content of at least 20 at %.

3. The photomask blank of claim 1 wherein the surface of the chromium-containing film disposed remote from the substrate has a root mean square roughness (RMS) of up to 1 nm and a maximum height difference (Rmax) of up to 9 nm, as analyzed on any area of 1 μm squares by surface profile measurement under atomic force microscope.

4. The photomask blank of claim 1 wherein the chromium-containing film has a thickness of up to 70 nm.

5. The photomask blank of claim 1 wherein the chromium-containing film has an optical density of at least 1.5 with respect to the exposure light.

6. The photomask blank of claim 1 wherein the chromium-containing film is constructed by multiple layers, the layer of the chromium-containing film which is disposed remotest from the substrate is a layer composed of a carbon-free chromium compound.

7. The photomask blank of claim 6 wherein the layer composed of a carbon-free chromium compound contains nitrogen or nitrogen and oxygen and has a nitrogen content of at least 5 at % and a thickness of 1 to 5 nm.

8. The photomask blank of claim 7 wherein the layer composed of a carbon-free chromium compound contains nitrogen and oxygen and has a chromium content of up to 50 at % and a nitrogen content of at least 40 at %.

9. The photomask blank of claim 1 wherein the chromium-containing film is disposed on the transparent substrate through the optical film, and the optical film includes a phase shift film formed of a material containing silicon, but not a transition metal or a material containing silicon and a transition metal.

10. The photomask blank of claim 9 wherein the sum of optical densities of the chromium-containing film and the phase shift film with respect to the exposure light is at least 2.5.

11. The photomask blank of claim 1, further comprising a hard mask film of silicon-containing material on the chromium-containing film.

12. A method for producing a photomask from the photomask blank of claim 1, comprising the step of patterning the chromium-containing film of the photomask blank by oxygen-containing chlorine based dry etching.

13. The photomask blank of claim 1 wherein the chromium-containing film is constructed by multiple layers.

* * * * *